United States Patent
Tsubata

(10) Patent No.: US 9,397,289 B2
(45) Date of Patent: Jul. 19, 2016

(54) NONVOLATILE SEMICONDUCTOR MEMORY DEVICE AND METHOD OF MANUFACTURING THE SAME

(71) Applicant: Shuichi Tsubata, Seoul (KR)

(72) Inventor: Shuichi Tsubata, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 19 days.

(21) Appl. No.: 14/312,184

(22) Filed: Jun. 23, 2014

(65) Prior Publication Data
US 2015/0255712 A1    Sep. 10, 2015

Related U.S. Application Data

(60) Provisional application No. 61/948,427, filed on Mar. 5, 2014.

(51) Int. Cl.
| | |
|---|---|
| H01L 43/02 | (2006.01) |
| H01L 43/12 | (2006.01) |
| H01L 27/22 | (2006.01) |
| H01L 43/08 | (2006.01) |

(52) U.S. Cl.
CPC .............. *H01L 43/12* (2013.01); *H01L 27/228* (2013.01); *H01L 43/08* (2013.01)

(58) Field of Classification Search
CPC ......... H01L 43/02; H01L 43/08; H01L 43/12; H01L 27/228
See application file for complete search history.

(56) References Cited

U.S. PATENT DOCUMENTS

| | | | | |
|---|---|---|---|---|
| 5,578,530 | A | 11/1996 | Muroyama et al. | |
| 8,081,505 | B2 * | 12/2011 | Kajiyama | G11C 11/16 257/108 |
| 8,264,053 | B2 * | 9/2012 | Tsukamoto | G11C 11/16 257/20 |
| 8,339,841 | B2 * | 12/2012 | Iwayama | B82Y 25/00 257/295 |
| 8,922,018 | B2 * | 12/2014 | Ishizaki | H01L 27/2481 257/751 |
| 9,093,632 | B2 * | 7/2015 | Tsubata | H01L 43/02 |

FOREIGN PATENT DOCUMENTS

| | | | |
|---|---|---|---|
| JP | 4812310 | B2 | 11/2011 |
| JP | 2012079762 | A | 4/2012 |

OTHER PUBLICATIONS

Related U.S. Appl. No. 14/203,422, filed Mar. 10, 2014, First Named Inventor: Shuichi Tsubata, Title: "Nonvolatile Semiconductor Memory Device and Method of Manufacturing the Same".

* cited by examiner

*Primary Examiner* — Allison P Bernstein
(74) *Attorney, Agent, or Firm* — Holtz, Holtz & Volek PC

(57) ABSTRACT

A nonvolatile semiconductor memory device is provided with a magnetoresistive effect element formed on a substrate, and an insulating film formed above the substrate to cover the magnetoresistive effect element. The insulating film is formed of a silicon nitride, and has a portion of a higher nitrogen concentration than a surface portion thereof.

6 Claims, 7 Drawing Sheets

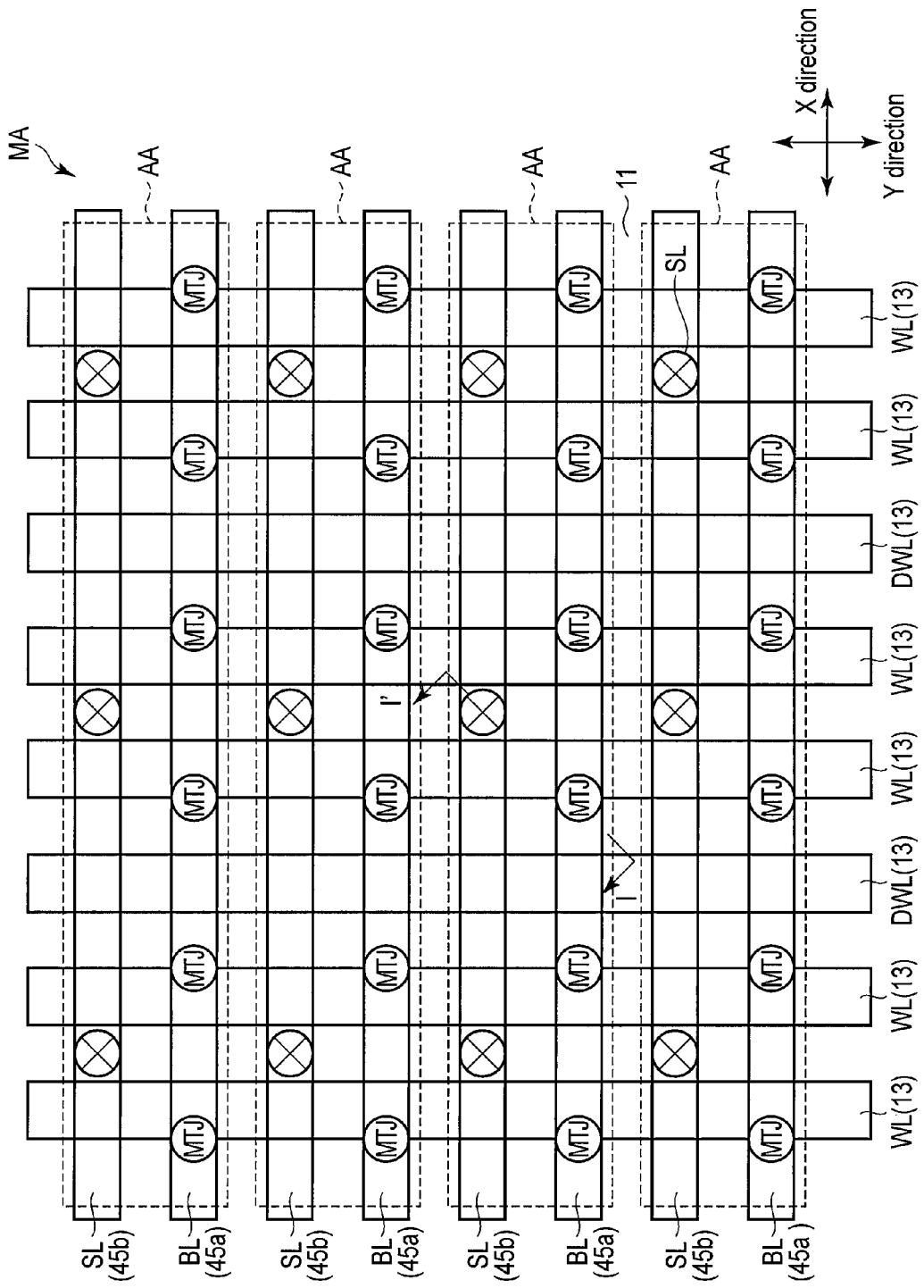
F I G. 2

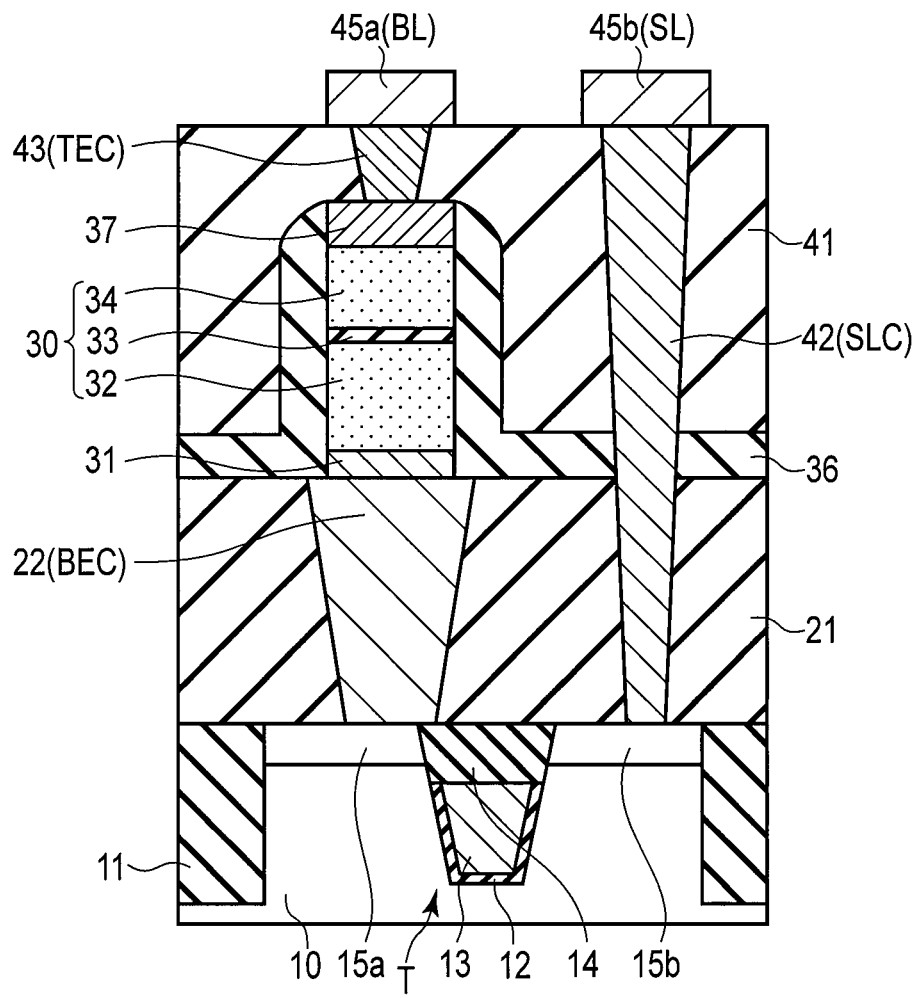
F I G. 3

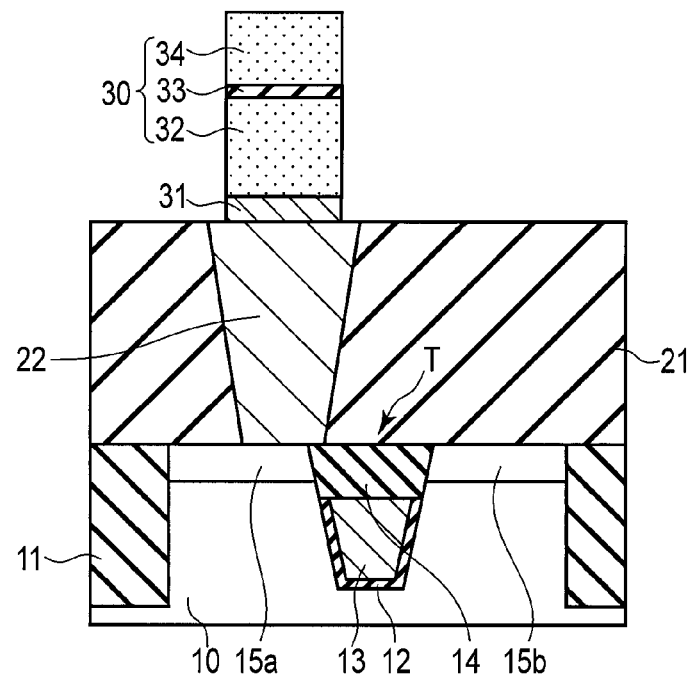
F I G. 4A
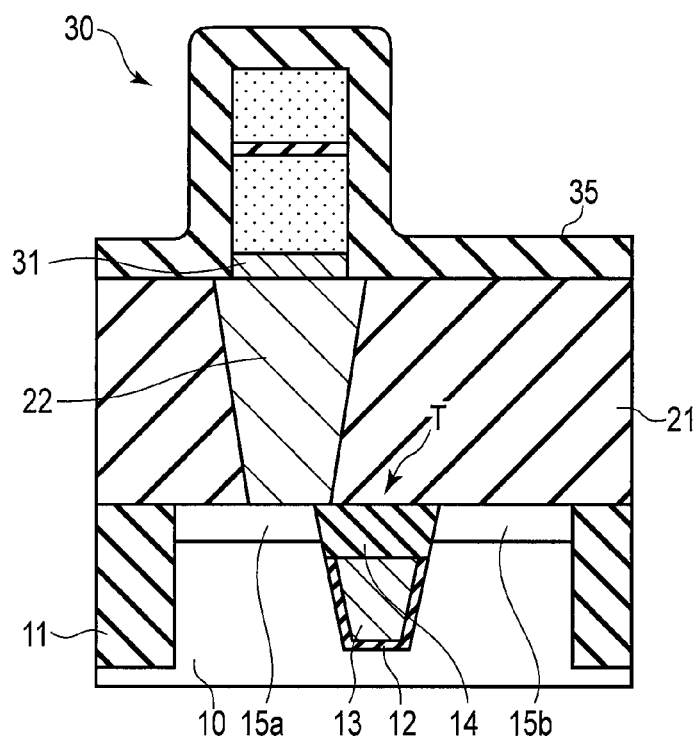
F I G. 4B

NONVOLATILE SEMICONDUCTOR MEMORY DEVICE AND METHOD OF MANUFACTURING THE SAME

CROSS-REFERENCE TO RELATED APPLICATIONS

This application claims the benefit of U.S. Provisional Application No. 61/948,427, filed Mar. 5, 2014, the entire contents of which are incorporated herein by reference.

FIELD

Embodiments described herein relate generally to a nonvolatile semiconductor memory device, and a method of manufacturing the same.

BACKGROUND

As one of nonvolatile semiconductor memory devices, expectations and attention have recently been focused on a large-capacity magnetoresistive random access memory (MRAM) using a magnetic tunnel junction (MTJ) element. In the MTJ element used for the MRAM, one of the two ferromagnetic layers that sandwich a tunnel barrier layer is set as a magnetization fixed layer (reference layer) where the direction of magnetization is fixed, and the other layer is set as a magnetization free layer (storage layer) where the direction of magnetization is made to be easily inverted. In this structure, information can be stored by associating, with binary numbers "0" and "1," a state in which the direction of magnetization is parallel between the reference layer and the storage layer, and a state in which the direction of magnetization is opposite between them.

BRIEF DESCRIPTION OF THE DRAWINGS

FIG. 2 is a plan view showing the memory cell array of the MRAM of the embodiment;

FIG. 3 is a cross-sectional view taken along line I-I' of FIG. 2;

FIGS. 4A to 4D are cross-sectional views showing a process of manufacturing the MRAM of the embodiment;

DETAILED DESCRIPTION

In general, according to one embodiment, a nonvolatile semiconductor memory device is provided with a magnetoresistive effect element formed on a substrate; and a insulating film formed above the substrate to cover the magnetoresistive effect element. The insulating film is formed of a silicon nitride, and has a portion of a higher nitrogen concentration than a surface portion thereof.

(Embodiment)

An embodiment will be described with reference to the accompanying drawings.

Through the entire figures, like reference numbers denote like elements or structures. However, the figures are merely schematic ones, and therefore it should be noted that the relationship between the thickness and planar size, the ratio in thickness between layers, etc., differ from those of the actual ones. Specific thicknesses or sizes should be determined referring to the descriptions below. Further, it is a matter of course that the figures contain portions different in size and/or ratio relationship.

To prevent extra oxidation in a later process, the MTJ element needs a protective insulating film, such as a silicon nitride film (SiN). This protective insulating film must be deposited conformal in order to passivate the entire surface of the MTJ element. Furthermore, for MTJ thermal budget, the protective insulating film must be deposited at a temperature of 300° C. or less.

An SiN film as a protective insulating film can be deposited by, for example, a radial line slot antenna (RLSA) plasma CVD. In this case, the raw material (source) gas is Trisilylamine (TSA), and the process temperature is about 300° C. The resultant SiN film is formed conformal, and has a tendency to be silicon (Si) rich compared to the stoichiometric composition. However, the Si-rich SiN film has a low resistance and a high leak property, and is therefore inappropriate as the protective insulating film.

In view of this, in the embodiment, in order to simultaneously achieve conformal and low leak properties, nitrogen (N) ions are implanted into the Si-rich SiN film formed conformal to modify to an N-rich SiN film. This can realize suppression of leak current with high step coverage maintained.

<Overall Structure Example of MRAM>

Figure 1:
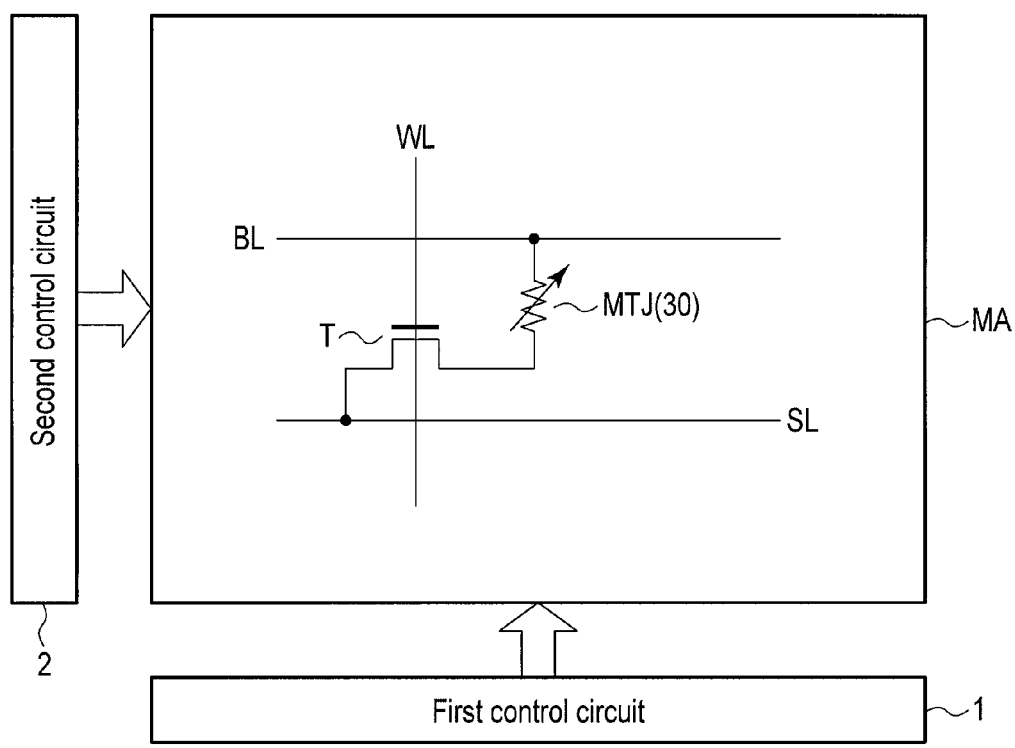
FIG. 1 a circuit diagram showing the memory cell array of an MRAM according to an embodiment.

FIG. 1 is a circuit diagram showing the memory cell array of an MRAM according to the embodiment.

Each memory cell in a memory cell array MA comprises a series connection of a magnetoresistive effect element (MTJ element) 30 and a switch element (e.g., a field effect transistor (FET)) T. The series connection has one end (one end of the magnetoresistive effect element 30) electrically connected to a bit line BL, and the other end (one of the switch element T) electrically connected to a source line SL.

The control terminal of the switch element T, e.g., the gate electrode of the FET, is electrically connected to a word line WL. The potential of the word line WL is controlled by a first control circuit 1. Further, the potentials of the bit line BL and the source line SL are controlled by a second control circuit 2.

<Detailed Structure of MRAM>

Referring now to FIGS. 2 and 3, the structure of the MRAM of the embodiment will be described in detail.

FIG. 2 is a plan view showing the cells of the MRAM of the embodiment arranged in an array (hereinafter referred to as a memory cell array). FIG. 3 is a cross-sectional view taken along line I-I' of FIG. 2. FIG. 3 shows both the cross section of the magnetoresistive effect element 30 and that of a source line contact.

As shown in FIG. 2, the memory cell array MA comprises, for example, a plurality of word lines WL and a plurality of dummy word lines DWL extending in a Y direction, and a plurality of bit lines BL and a plurality of source lines SL extending in an X direction. The X direction intersects the Y direction.

Combinations each including two word lines WL and one dummy word line DWL are arranged in the X direction. The bit lines BL and the source lines SL are alternately arranged in the Y direction such that combinations each including one bit line BL and one source line SL are provided on respective active areas AA. Element isolation layers 11 are embedded between respective pairs of adjacent active areas AA. Namely, in the Y direction, the element isolation layers 11 and the active areas AA are alternately arranged.

The element isolation layers 11 are formed by, for example, shallow trench isolation (STI). The element isolation layers 11 are formed of an insulating material of a high embedding property, such as silicon nitride (SiN).

A description will now be given of the cross-sectional structure.

As shown in FIG. 3, in the memory cell array MA, an element isolation layer 11 is provided in the surface region of a p-type semiconductor substrate (e.g., a silicon substrate) 10 to surround an active area AA.

A selective transistor T serving as a switching element T and formed of, for example, an n-channel metal oxide semiconductor field effect transistor (MOSFET) is provided in the semiconductor substrate 10. The selective transistor T has a structure in which a gate electrode 13 containing, for example, polysilicon is embedded in a recess formed in the semiconductor substrate 10.

More specifically, the selective transistor T comprises a gate insulating layer 12, a gate electrode 13 and two diffusion layers 15a and 15b (i.e., a drain-side diffusion layer and a source-side diffusion layer). The gate insulating layer 12 is formed on the inner surface of the lower portion of the recess that is formed in the surface of the semiconductor substrate 10 and extends in the Y direction. The gate electrode 13 is formed on the inner surface of the gate insulating layer 12 to fill the lower portion of the recess. The gate electrode 13 corresponds to the word line WL.

An insulating layer 14 formed of, for example, SiN is provided on the upper surfaces of the gate insulating layer 12 and the gate electrode 13 to fill the upper portion of the recess. The upper surface of the insulating layer 14 is substantially level with the upper surface of the semiconductor substrate 10 (i.e., the upper surfaces of the diffusion layers 15a and 15b).

The diffusion layers 15a and 15b formed in the surface of the semiconductor substrate 10 sandwich the gate insulating layer 12, the gate electrode 13 and the insulating layer 14. Further, as shown in FIG. 3, the element isolation layer 11 is located at the opposite ends of the diffusion layers 15a and 15b.

An interlayer insulating layer 21 is formed on the semiconductor substrate 10 (more specifically, on the insulating layer 14 and the diffusion layers 15a and 15b). A first contact plug 22 is formed in the interlayer insulating layer 21 formed on the diffusion layers 15a. The contact plug 22 will hereinafter be referred to as a bottom electrode contact (BEC).

The BEC 22 is formed on a part of the upper surface of the diffusion layer 15a and a part of the upper surface of the insulating layer 14. In other words, the BEC 22 and the diffusion layer 15a overlap each other in a cross section. This is because the BEC 22 and the diffusion layer 15a are formed by different methods. The BEC 22 contains, for example, TiN, but is not limited to this.

A second contact plug 42 is provided on the diffusion layer 15b such that it extends through the interlayer insulating layer 21 and has its bottom kept in contact with the diffusion layer 15b. The contact plug 42 also extends through an interlayer insulating layer 41, described later, such that its upper surface contacts the source line (45b (SL) in FIG. 3). Namely, the contact plug 42 forms a source line contact (SLC). The structure including the semiconductor substrate 10, the selective transistor T, the interlayer insulating layer 21 and the contact plugs 22 and 42 is defined as a substrate (main substrate).

A magnetoresistive effect element (hereinafter, MTJ) 30 electrically connected to the BEC 22 is formed on the BEC 22. Namely, a lower electrode 31 is formed on the BEC 22, and the MTJ 30 is formed on the lower electrode.

The MTJ 30 is provided on the upper surface of the lower electrode 31. The MTJ 30 is formed, for example, cylindrical with a circular cross section. In the embodiment, the planar area of the MTJ 30 is the same as that of the lower electrode 31. However, it is desirable that the planar area of the MTJ 30 be smaller than that of the lower electrode 31. In this structure, the overall lower surface of the MTJ 30 contacts the upper surface of the lower electrode 31, whereby the contact resistance therebetween can be reduced.

The MTJ 30 comprises a storage layer 32 formed of, for example, CoFeB, a tunnel barrier layer 33 formed of, for example, MgO, and a reference layer 34 formed of, for example, CoFeB, provided in this order from the bottom. Thus, the storage layer 32 is provided via the lower electrode 31 on the BEC 22.

The storage layer 32 is a ferromagnetic layer that has its magnetization direction set variable, and has a vertical magnetic anisotropy perpendicular or substantially perpendicular to the film surface (upper/lower surfaces). The term "variable magnetization direction" means that the direction of magnetization varies in accordance with a predetermined write current. Further, the expression "substantially perpendicular" means that the direction of residual magnetization falls within $45°<\theta\leq 90°$ with respect to the film surface.

A tunnel barrier layer 33 is formed on the storage layer 32, and a reference layer 34 is formed on the tunnel barrier layer 33. The tunnel barrier layer 33 is a nonmagnetic layer and contains a nonmagnetic material, such as MgO. However, the material of the layer 33 is not limited to this, and the layer 33 may contain a metal oxide, such as $Al_2O_3$, MgAlO, ZnO or TiO.

The reference layer 34 is a ferromagnetic layer having its magnetization direction unchanged, and has a perpendicular magnetic anisotropy in which the magnetization direction is perpendicular or substantially perpendicular to the film surface. The expression "unchanged magnetization direction" means that the magnetization direction does not change with respect to a predetermined write current. Namely, the reference layer 34 has a greater inversion energy barrier in the magnetization direction than the storage layer 32.

Although FIG. 3 shows an example where the center of the BEC 22 is aligned with the center of the MTJ 30, there is no problem even when these centers are slightly displaced from each other, if the BEC 22 and the MTJ 30 (i.e., the lower electrode 31) sufficiently contact each other. Further, although FIG. 3 shows an example where the upper surface of the BEC 22 is greater than the lower surface of the MTJ 30, the former may be smaller than the latter.

A SiN film (second protective insulating film) 36 is formed on the upper and side surfaces of the MTJ 30 and the surfaces (upper surfaces) of the BEC 22 and the interlayer insulating layer 21.

<Protective Insulating Film>

The protective insulating film 36 is formed conformal on the side surfaces of the lower electrode 31, the storage layer 32, the tunnel barrier layer 33 and the reference layer 34, and on the upper surfaces of the BEC 22 and the interlayer insulating layer 21. The protective insulating film 36 is an N-rich SiN. Namely, the ratio of nitrogen to silicon in the film 36 is greater than that of the case ($Si_3N_4$) where the ratio of x to y of SixNy is set to a stoichiometric composition ratio of 3:4. Further, the protective insulating film 36 is formed of a material having a lower conductivity than SiN of the stoichiometric composition. Namely, the conductivity of the protective insulating film 36 can be reduced by setting SiN to an N-rich composition ratio.

The N-rich SiN can be obtained by implanting N ions into an Si-rich SiN, as will be described later. The film thickness of the protective insulating film 36 is about 10 nm to 20 nm. In addition, SiN contains about 10% hydrogen derived from a raw gas. Although the function of H is not clear, there is a tendency for an Si-rich SiN to contain a greater amount of H. A mechanism, in which H is replaced with N during the time when an Si-rich SiN is modified into an N-rich SiN, is known.

Referring again to FIG. 3, a further description will be given of the structure.

An upper electrode 37 is formed on the reference layer 34, and an interlayer insulating layer 41 is formed on the upper electrode 37 and the protective insulating film 36. A contact plug (a top electrode contact, which will be hereinafter referred to as a TEC) having a bottom surface set in contact with the upper surface of the upper electrode 37, and an upper surface set in contact with a bit line (45*a* (BL)) is formed in the interlayer insulating layer 41.

Further, as described above, the contact plug 42 is formed through the interlayer insulating layers 41 and 21 and the protective insulating film 36. The bottom of the contact plug 42 is connected to the upper surface of the diffusion layer 15*b*, and the upper surface of the same is connected to the source line (45*b* (SL)).

As shown in FIG. 2, two of the three gate electrodes 13 adjacent in the X direction correspond to the word lines WL electrically connected to the magnetoresistive effect element 30, and the other one gate electrode 13 corresponds to the dummy word line DWL that is not electrically connected to the magnetoresistive effect element 30.

<Manufacturing Process>

Referring to FIGS. 4A to 4D, a description will be given of an MRAM manufacturing process according to the embodiment.

Firstly, using a conventional technique, the interlayer insulating layer 21 is formed on the semiconductor substrate 10 in which a switching MOS transistor having an embedded gate is formed. Subsequently, the BEC 22 is formed in the interlayer insulating layer 21.

After that, the metal layer (lower electrode) 31, the storage layer 32, the tunnel barrier layer 33 and the reference layer 34 are sequentially stacked on the interlayer insulating layer 21 and the BEC 22, and then a resist pattern (not shown) is formed on the reference layer 34.

Thereafter, using the resist as a mask, the reference layer 34, the tunnel barrier layer 33, the storage layer 32 and the metal layer 31 are etched to form the gate structure shown in FIG. 4A. At this time, the corners of the reference layer 34 of the gate structure are slightly rounded.

Subsequently, the resist is removed, and an SiN film is deposited with the semiconductor substrate kept at about 300° C., by RLSA plasma CVD using Trisilylamine (TSA). Namely, as shown in FIG. 4B, an SiN film (first protective insulating film) 35 is formed to cover the upper surfaces of the interlayer insulating layer 21 and the BEC 22 and the upper and side surfaces of the gate structure. As a result, an SiN film 35 having a uniform film thickness and rich in Si in stoichiometric composition is formed to cover the interlayer insulating layer 21, the BEC 22 and the gate structure.

The reason why the temperature of the semiconductor substrate is set to 300° C. is that if the SiN film 35 is formed at a temperature of not less than 300° C., the metal layer 31 or the storage layer 32 may be damaged. Further, the reason why PLSA plasma CVD is used is to form the SiN film 35 conformal. In the PLSA plasma CVD, the SiN film 35 is formed rich in Si.

Figure 4C:
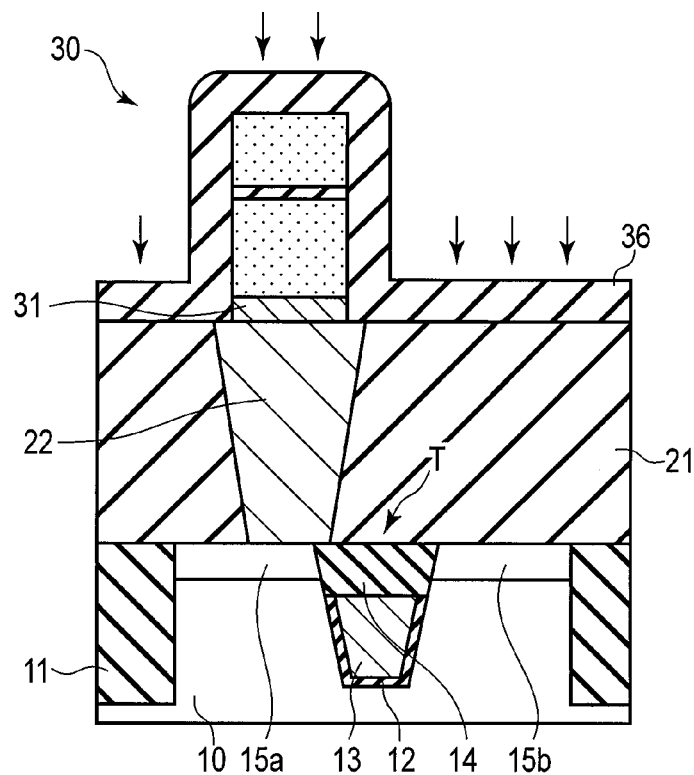

After that, as shown in FIG. 4C, the insulating film 35 is changed (modified) into an N-rich SiN film (second protective insulating film) 36 by implanting N ions into the SiN film 35. Namely, in the ratio of x to y of SixNy, the ratio of nitrogen to silicon is increased. More specifically, as described above, an SiN with the ratio of nitrogen increased close to 3:4 is formed, or with an N amount greater than this reference value.

Figure 4D:
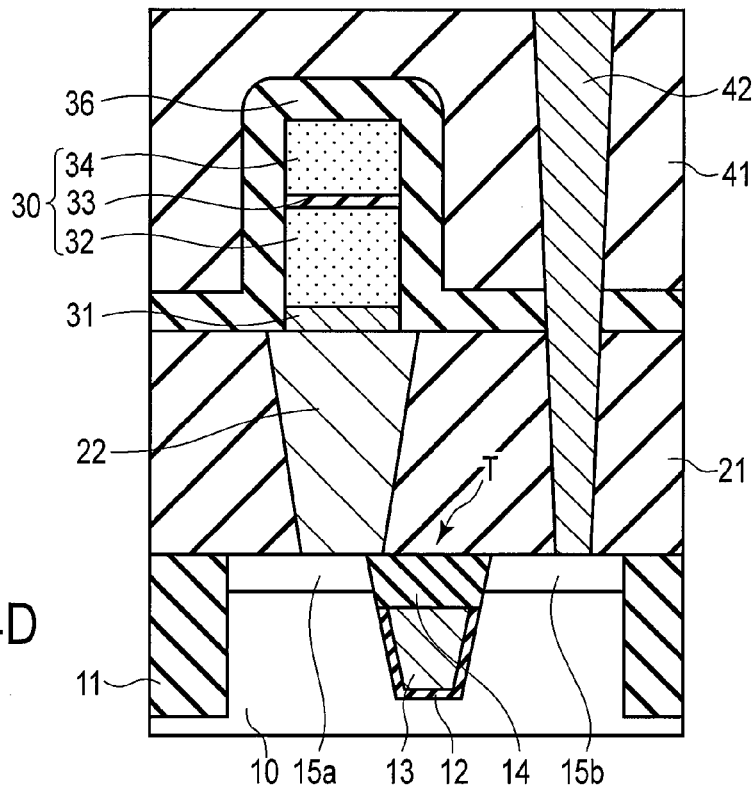

Further, as shown in FIG. 4D, after an interlayer insulating film 41 is formed on the protective insulating film 36, a contact plug 42 connected to the diffusion layer 15*b* is formed. After this step, part of the protective insulating film 36 is removed, then an upper electrode 37 and a TEC 43 connected thereto are formed, and wiring layers, such as BL and SL, are formed, with the result that the structure shown in FIG. 3 is completed.

Figure 5A:
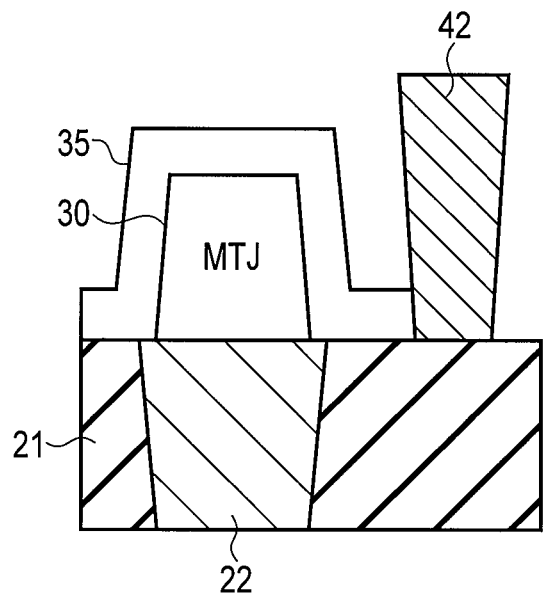
FIGS. 5A and 5B are cross-sectional views showing the difference in the shapes of the protective insulation films manufactured by different processes.

In the step shown in FIG. 4B, if SiN is deposited using plasma CVD, an SiN film 35 can be formed conformal on the upper and side surfaces of the MTJ 30 as shown in FIG. 5A. In particular, in the case of using PLSA plasma CVD, an extremely excellent step coverage can be obtained for the MTJ 30. In this case, however, the SiN film 35 is Si-rich, and is therefore inappropriate as a protective insulating film if nothing is done.

Figure 5B:
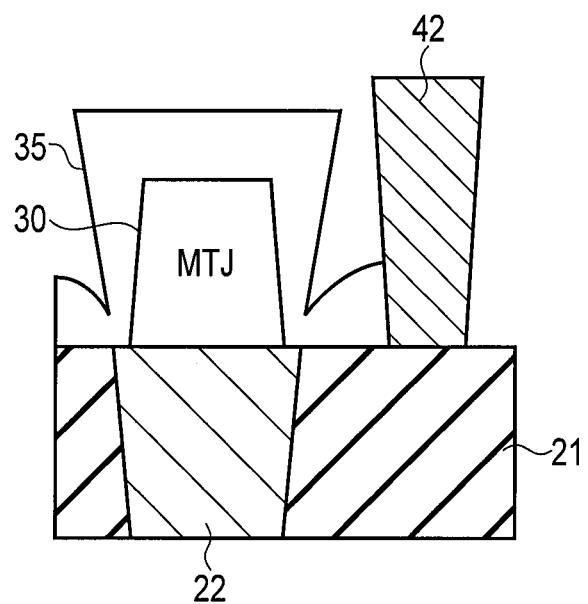

In contrast, to form an N-rich SiN film 36, if plasma CVD and plasma nitriding are performed alternately, volume expansion will occur on the upper surfaces of the MTJ 30 and the interlayer insulating layer 21 as shown in FIG. 5B, whereby the SiN film cannot be formed conformal. Namely, plasma nitriding advances in an anisotropic manner, and volume expansion due to the nitriding reduces the step coverage for the MTJ 30.

Furthermore, if plasma nitriding is performed after a conformal SiN film 35 is formed as shown in FIG. 5A, only the nitrogen composition ratio of the surface is increased, but that of the entire SiN film 35 cannot be increased. Namely, even if nitrogen is introduced into the Si-rich SiN film 35 by plasma nitriding, the entire SiN film 35 cannot be made N-rich, although the nitrogen composition ratio of the surface can be enhanced.

Figure 6A:
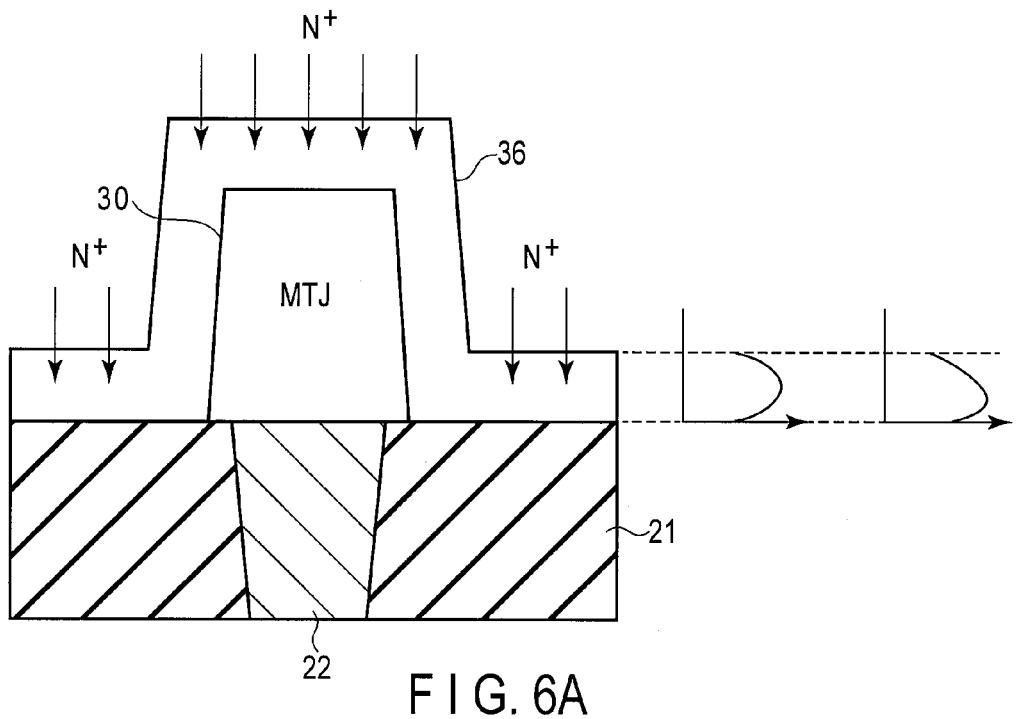
FIGS. 6A and 6B are cross-sectional views showing examples of ion implantation for nitriding the protective insulation film.

In view of the above, in the embodiment, N ions are implanted by ion implantation into the S-rich SiN film 35 formed conformal by the plasma CVD, as is shown in FIG. 6A, thereby increasing the nitrogen composition ratio in the SiN film 35 to form an N-rich SiN film 36. Although depending upon the accelerated voltage applied during ion implantation, the N concentration in the SiN film 36 exhibits a peak value at the central portion along the film thickness or at a portion close to the bottom of the film 36, as is shown in FIG. 6A. Thus, the entire SiN film can be modified into an N-rich SiN film.

Further, when N ions are implanted perpendicular to the substrate as shown in FIG. 6A, the nitrogen composition ratio of each upper surface of the MTJ 30 and the interlayer insulating layer 21 becomes greater than that of the side surfaces of the MTJ 30. Further, the implantation of nitrogen causes slight volume expansion of the SiN film 36 at the upper surfaces of the MTJ 30 and the interlayer insulating layer 21. However, this will raise little problem.

When the distance between the contact plugs 22 and 42 is extremely short, a leak of current at the bottom of the SiN film 36 will raise a serious problem. In the example of FIG. 6A, since the nitrogen composition of a central portion along the thickness or a bottom portion, of the SiN film 36 on the interlayer insulating layer 21 can be increased, the above-mentioned leak can be sufficiently suppressed.

Figure 6B:
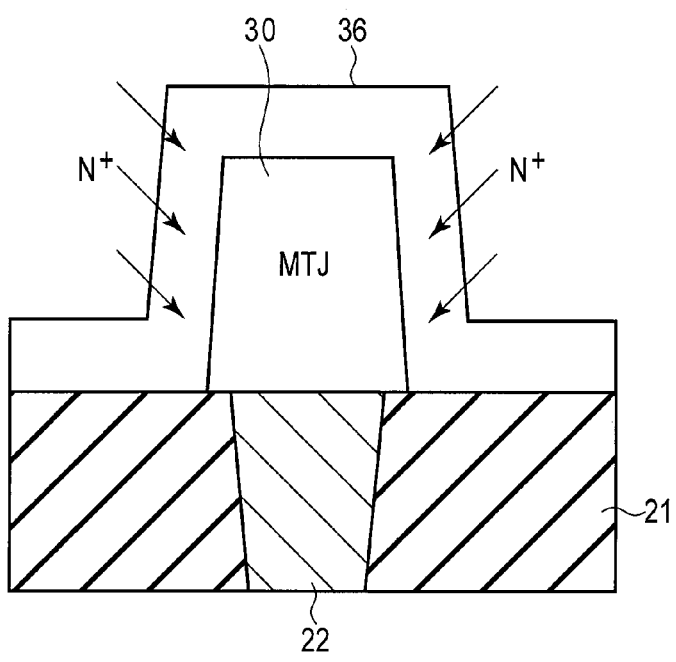

Furthermore, when N ions are implanted obliquely with respect to the substrate surface as shown in FIG. 6B, they are implanted into the side surfaces of the MTJ 30 as well as the upper surface, with the result that the upper and side surfaces of the MTJ 30 and the upper surface of the interlayer insulating layer 21 exhibit substantially the same nitrogen composition ratio to thereby make the film thickness of each portion uniform. As a result, a more conformal shape can be achieved.

If the distance between the gate portion and the contact plug 42 is extremely short, a leak of current in the SiN film 36 provided on the gate side surfaces becomes a serious problem. In the example of FIG. 6B, by obliquely implanting ions to increase the nitrogen composition ratio of the SiN film 36 on the side surfaces, the above-mentioned leak can be sufficiently suppressed.

<Advantages of the Embodiment>

In the embodiment, after an SiN film 35 rich in Si in the stoichiometric composition is deposited by plasma CVD, it is modified into an SiN film 36 rich in N in the stoichiometric composition, by the ion implantation. Thus, the N-rich SiN film 36 can be formed with its shape as the protective insulating film of the MTJ 30 unchanged. Since in this case, a conformal SiN film can be formed by plasma CVD, and the surface shape of the SiN film is not greatly changed by ion implantation, conformal and low leak properties can be simultaneously satisfied. As a result, erroneous operations of the resultant nonvolatile semiconductor memory device can be suppressed, thereby enhancing the reliability of the device.

Further, when N ions are implanted from a direction perpendicular to the substrate surface, a leak of current, in particular, due to the short distance between the contact plugs 22 and 42 can be efficiently suppressed. Furthermore, when N ions are implanted obliquely with respect to the substrate surface, a leak of current, in particular, due to the short distance between the MTJ 30 and the contact plug 42 can be efficiently suppressed.

(Modifications)

The invention is not limited to the above-described embodiment.

Although RLSA plasma CVD is used to form a protective insulating film for the magnetoresistive effect element, PLSA as a plasma source is not indispensable, but ordinary plasma CVD may be used. Further, the use of plasma is not indispensable. Instead, ordinary CVD may be used. It is sufficient if a conformal SiN film can be deposited at a low temperature not higher than 300° C.

Further, the thickness of the protective insulating film can be varied in accordance with the specifications. In addition, the lower and upper electrodes of the MTJ element are provided to reduce the connection resistance between the MTJ element and the contact plug as much as possible, and can be omitted.

Moreover, the magnetoresistive effect element is not limited to the MTJ element in which the tunnel barrier layer is held between the storage layer and the reference layer. It is sufficient if the magnetoresistive effect element is formed of a material that has its resistance value varied by a current or magnetism, and keeps its varied state. Namely, the technique of the invention is not limited to the MTJ element, but is also applicable to various types of magnetoresistive effect elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a magnetoresistive effect element provided on a substrate; and
an insulating film provided above the substrate to cover the magnetoresistive effect element, the insulating film being a nitrogen-rich silicon nitride insulating film and having a portion with a higher nitrogen concentration than a surface portion thereof.

2. The device of claim 1, wherein the insulating film has the surface portion, a central portion along a thickness thereof, and a bottom portion, a nitrogen composition ratio of the insulating film being higher in the central portion or in the bottom portion than in the surface portion.

3. The device of claim 1, wherein:
the nitrogen-rich silicon nitride insulating film is a silicon-rich silicon nitride film into which nitrogen ions are implanted from a direction perpendicular to a surface of the substrate; and
a nitrogen composition ratio of the insulating film is higher in portions on an upper surface of the magnetoresistive effect element or on an upper surface of the substrate than in a portion on a side surface of the magnetoresistive effect element.

4. The device of claim 1, wherein the nitrogen-rich silicon nitride insulating film, is a silicon-rich silicon nitride film into which nitrogen ions are implanted from a direction oblique to a surface of the substrate.

5. The device of claim 1, wherein the magnetoresistive effect element has a stacked layer structure in which a tunnel barrier layer of a nonmagnetic material is held between a storage layer of a ferromagnetic material having a magnetization direction thereof set variable, and a reference layer of a ferromagnetic material having a magnetization direction thereof set invariable.

6. The device of claim 1, wherein:
the substrate comprises a transistor provided in a surface portion of a semiconductor substrate, an interlayer insulating film provided on the semiconductor substrate, a first contact plug connected to one of a source and a drain of the transistor and exposed in an upper surface of the interlayer insulating film, and a second contact plug connected to the other of the source and the drain of the transistor and exposed in the upper surface of the interlayer insulating film;
the magnetoresistive effect element has a stacked layer structure in which a tunnel barrier layer of a nonmagnetic material is held between a storage layer of a ferromagnetic material having a magnetization direction thereof set variable, and a reference layer of a ferromagnetic material having a magnetization direction thereof set invariable, one of the storage layer and the reference layer being connected to the first contact plug; and
the insulating film is interposed between the magnetoresistive effect element and the second contact plug.

* * * * *